(12) United States Patent
Narita

(10) Patent No.: US 9,640,526 B2
(45) Date of Patent: May 2, 2017

(54) SEMICONDUCTOR DEVICE

(71) Applicant: Renesas Electronics Corporation, Kawasaki-shi, Kanagawa (JP)

(72) Inventor: Koki Narita, Kawasaki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/807,735

(22) Filed: Jul. 23, 2015

(65) Prior Publication Data
US 2016/0064373 A1    Mar. 3, 2016

(30) Foreign Application Priority Data

Aug. 28, 2014 (JP) ................................. 2014-173798

(51) Int. Cl.
| | |
|---|---|
| H01L 23/62 | (2006.01) |
| H01L 27/02 | (2006.01) |
| H01L 27/06 | (2006.01) |
| H01L 23/522 | (2006.01) |
| H01L 29/78 | (2006.01) |

(52) U.S. Cl.
CPC ...... H01L 27/0266 (2013.01); H01L 23/5221 (2013.01); H01L 27/0255 (2013.01); H01L 27/0629 (2013.01); H01L 29/78 (2013.01); H01L 2924/0002 (2013.01)

(58) Field of Classification Search
CPC ............... H01L 23/535; H01L 27/0255; H01L 27/0629; H01L 29/0696; H01L 29/41758; H01L 29/4232; H01L 27/0266
See application file for complete search history.

(56) References Cited

U.S. PATENT DOCUMENTS

| | | | | |
|---|---|---|---|---|
| 8,648,425 B2* | 2/2014 | Wang | ...................... | H01L 28/20 257/379 |
| 2005/0133839 A1 | 6/2005 | Okushima | | |
| 2012/0038003 A1* | 2/2012 | Kawachi | ............. | H01L 27/0277 257/371 |
| 2013/0292745 A1* | 11/2013 | Liu | ...................... | H01L 27/0255 257/288 |
| 2015/0311342 A1* | 10/2015 | Lin | ...................... | H01L 29/7848 257/190 |

FOREIGN PATENT DOCUMENTS

JP    2005-183661 A    7/2005

* cited by examiner

Primary Examiner — William F Kraig
Assistant Examiner — Khatib Rahman
(74) Attorney, Agent, or Firm — McDermott Will & Emery LLP

(57) ABSTRACT

A semiconductor device includes a plurality of gate electrodes, and a plurality of stripe contacts, each formed alternately with each of the gate electrodes along a length direction of the gate electrodes. A conductive transistor with a reference potential applied to one of the stripe contacts forming one of a source and a drain is formed. One of the gate electrodes adjacent to one of the stripe contacts forming the other of the source and the drain is used as a first dummy gate electrode. The semiconductor device further includes a metal extending over the first dummy gate electrode to electrically connect together the stripe contacts formed on opposing sides of the first dummy gate electrode, and a pad connected to one of the stripe contacts formed on opposing sides of the first dummy gate electrode, which is provided across the first dummy gate electrode from the conductive transistor.

7 Claims, 10 Drawing Sheets

SEMICONDUCTOR DEVICE

CROSS-REFERENCE TO RELATED APPLICATIONS

This application claims priority to Japanese Patent Application No. 2014-173798 filed Aug. 28, 2014, the subject matter of which is incorporated herein by reference in entirety.

BACKGROUND OF THE INVENTION

Field of the Invention

The present disclosure relates to semiconductor devices, and more particularly to a semiconductor device including an ESD (Electro Static Discharge) protection element.

Description of the Background Art

With the recent improvements in function and performance of semiconductor devices, a need has arisen for multi-pin semiconductor devices having more than several thousand I/O pins (input/output pins). Accordingly, the area of each I/O block is increasingly having a greater influence on size and cost reductions of the entire semiconductor device. Elements which constitute a high percentage of the area of an I/O block are an electrostatic discharge protection element (ESD protection element) and a driver element of high drive power.

In this respect, a technique of adding resistance in order to improve the protection tolerance of an ESD protection element (ESD tolerance) is commonly employed.

For example, Japanese Patent Laying-Open No. 2005-183661 discloses a technique of adding a ballast resistor as resistance. Specifically, there is disclosed a technique of isolating a diffusion layer by STI (Shallow Trench Isolation) and providing the isolated diffusion layer with a resistive component to form a ballast resistor.

SUMMARY OF THE INVENTION

This technique, however, forms the diffusion layer as a ballast resistor, thus requiring special steps for forming the ballast resistor and becoming cumbersome.

The present disclosure has been made to solve the problem described above, and an object of the present disclosure is to provide a semiconductor device capable of attaining improved ESD tolerance in a simple manner.

The other problems and novel features will become more apparent from the description of the present specification and the accompanying drawings.

According to one embodiment, a semiconductor device includes a plurality of gate electrodes formed on a semiconductor substrate, and a plurality of stripe contacts, each formed alternately with each of the gate electrodes along a length direction of the gate electrodes, so as to form a source and a drain. A conductive transistor with a reference potential applied to one of the stripe contacts forming one of the source and the drain is formed, and one of the gate electrodes adjacent to one of the stripe contacts forming the other of the source and the drain of the conductive transistor is used as a first dummy gate electrode. The semiconductor device further includes a metal extending over the first dummy gate electrode to electrically connect together the stripe contacts formed on opposing sides of the first dummy gate electrode, and a pad connected to one of the stripe contacts formed on opposing sides of the first dummy gate electrode, which is provided across the first dummy gate electrode from the conductive transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments will be described in detail with reference to the drawings, in which the same or corresponding parts are designated by the same characters and the description thereof will not be repeated.

First Embodiment

Figure 1:
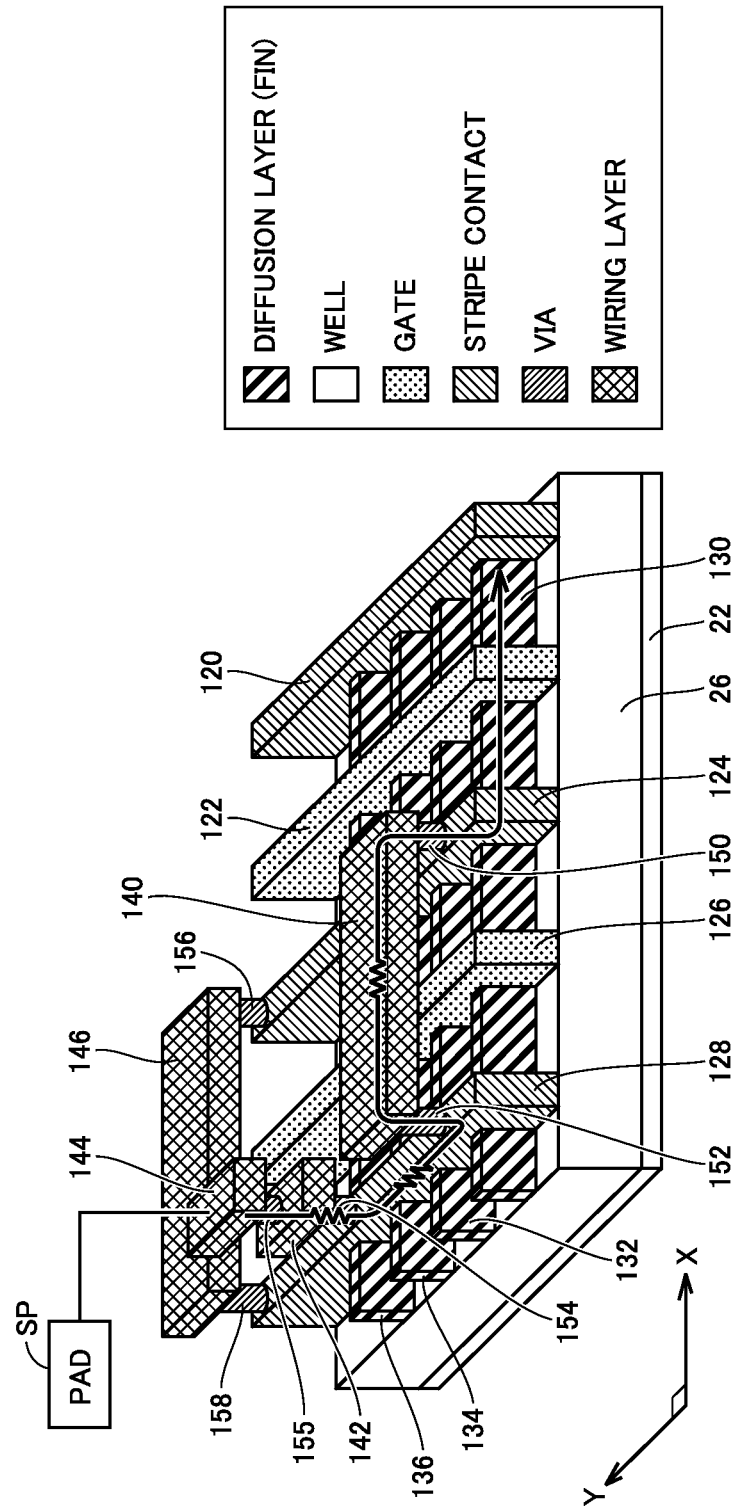
FIG. 1 is a diagram schematically illustrating the principle of an ESD protection element in a first embodiment.

FIG. 1 is a diagram schematically illustrating the principle of an ESD protection element in a first embodiment.

Referring to FIG. 1, a well 26 is formed on a semiconductor substrate 22 to form a FinFET. This example describes forming an ESD protection element.

A semiconductor device includes a plurality of gate electrodes 122 and 126 of a transistor formed on well 26 of semiconductor substrate 22, and a plurality of stripe contacts 120, 124 and 128 formed along a length direction (Y direction) of gate electrodes 122 and 126 so as to form a source and a drain of the transistor. Gate electrode 122, and stripe contacts 120 and 124 provided on opposing sides of gate electrode 122 form a conductive transistor. Although not shown, a reference potential (ground voltage VSS by way of example) is applied to stripe contact 120 of the conductive transistor. Gate electrode 126 is used as a dummy gate electrode. The semiconductor device further includes metals 140 and 146 extending over dummy gate electrode 126 to electrically connect together stripe contacts 124 and 128 formed on opposing sides of dummy gate electrode 126, and a pad SP connected to stripe contact 128.

The stripe contact is a metal wiring layer provided to connect the source and the drain formed in the same direction as the length direction of the gate electrodes to an upper metal wiring layer, and is formed to stand stereoscopically as with the gate electrodes.

Stripe contact 128 is connected to pad SP via the upper metal wiring layer. Specifically, pad SP is connected to stripe contact 128 via a metal 144 formed in a second layer, a metal 142 formed in a first layer, a via 155 provided between metal 144 formed in the second layer and metal 142 formed in the first layer, and a via 154 provided between metal 142 formed in the first layer and stripe contact 128.

A via 150 is provided between stripe contact 124 and metal 140 formed in the first layer, and a via 152 is provided between metal 140 and stripe contact 128.

A via 156 is provided between stripe contact 124 and metal 146 formed in the first layer, and a via 158 is provided between metal 146 and stripe contact 128.

Each of stripe contacts 120, 124 and 128 is formed alternately with each of gate electrodes 122 and 126 at regular intervals along an X direction.

Diffusion layers (fins) 130, 132, 134 and 136 are provided between stripe contacts 120 and 124. Gate electrodes 122 and 126 are formed to extend over diffusion layers (fins) 130, 132, 134 and 136 along the Y direction.

In this configuration, when an ESD current is applied to pad SP, a current path is formed from pad SP-metal 144-via 155-metal 142-via 154-stripe contact 128-via 152-metal 140-via 150-stripe contact 124-the conductive transistor-ground voltage VSS.

When the conductive transistor has low ESD tolerance, the entry of the ESD current through pad SP causes the occurrence of current concentration, which may result in breakdown of the conductive transistor (ESD protection element).

A FinFET is a transistor having a "fin" structure in which a channel portion stands stereoscopically on a semiconductor (Si) substrate. Since a gate wraps around the stereoscopic channel portion in this structure, the FinFET has greater controllability of the gate than a planar transistor, and improved on/off characteristics. The FinFET tends to have low ESD tolerance because, structurally, heat generated in the channel portion is less likely to escape to the Si substrate than in a planar transistor.

Thus, when the transistor is a FinFET, the risk of ESD breakdown increases. Methods of improving the ESD tolerance of a transistor include, as describe above, a method of providing a diffusion layer with a resistive component to form a ballast resistor. In this respect, although there is a method of increasing a region of the diffusion layer to provide a ballast resistor, manufacturing restrictions exist for fine processing such as FinFET processing.

In FinFET processing, from a manufacturing viewpoint of fine processing, it is required to dispose the gates at a constant pitch on the diffusion layer. Thus, the method of increasing the diffusion layer region cannot be employed.

In a semiconductor product by FinFET processing according to this embodiment, a layout structure where a ballast resistor is added can be realized while a constant pitch between the gates is maintained, without requiring any special steps.

In this embodiment, a ballast resistor is formed by providing the dummy gate electrode, and utilizing the stripe contact adjacent to this dummy gate electrode and the like.

Specifically, a ballast resistor is formed including a resistive component formed of metals 142, 144 and vias 154, 155, a resistive component formed of stripe contact 128, and a resistive component formed of vias 150, 152 and metal 140.

As a result, the ballast resistor can be formed in a simple manner to improve the protection tolerance of the ESD protection element, without requiring the cumbersome steps of isolating a diffusion layer by STI, providing the isolated diffusion layer with a resistive component and the like as in the conventional configuration.

Figure 2:
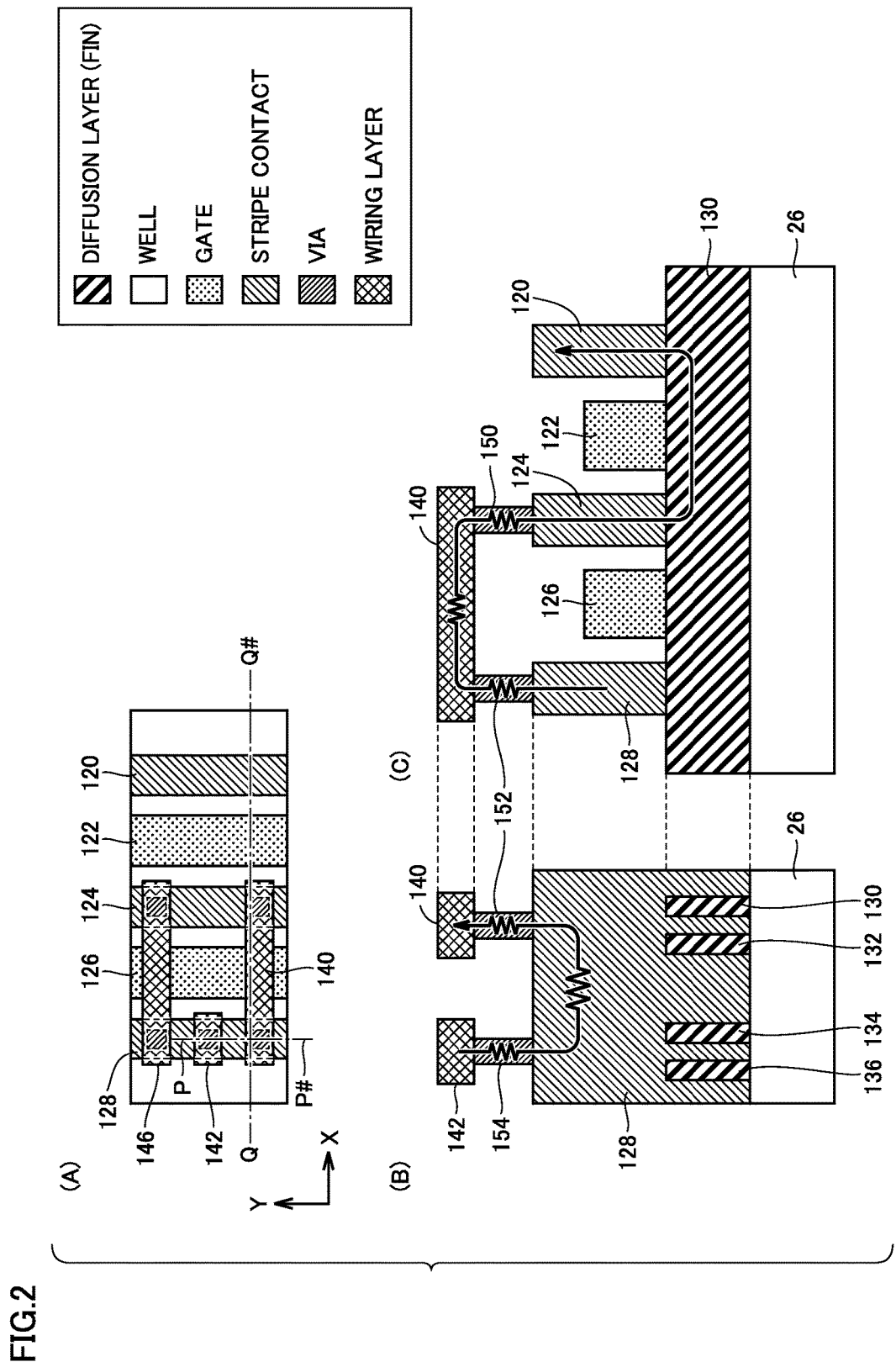
FIG. 2 is a diagram illustrating a structure of the ESD protection element based on the first embodiment.

FIG. 2 is a diagram illustrating a structure of the ESD protection element based on the first embodiment. FIG. 2(A) is a top view of the ESD protection element based on the first embodiment.

As shown in FIG. 2(A), the gate electrodes and the stripe contacts are disposed along the Y direction, where each of gate electrodes 122 and 126 is formed alternately with each of stripe contacts 120, 124 and 128 at a constant pitch along the X direction.

Gate electrode 126 serves as a dummy gate electrode, and metals 140 and 146 electrically connecting stripe contact 124 and stripe contact 128 together are disposed.

Although this example describes providing the plurality of metals 140 and 146 electrically connecting stripe contact 124 and stripe contact 128 together, it is only required to provide at least one metal.

FIG. 2(B) is a sectional view taken along P-P# in FIG. 2(A). As shown in FIG. 2(B), stripe contact 128 is formed to extend over diffusion layers 130, 132, 134 and 136. Metal 142 is connected to stripe contact 128 through via 154. Metal 140 is connected to stripe contact 128 through via 152.

The ESD current flows in a path from metal 142-via 154-stripe contact 128-via 152-metal 140.

FIG. 2(C) is a sectional view taken along Q-Q # in FIG. 2(A). As shown in FIG. 2(C), metal 140 is disposed to extend over dummy gate electrode 126. The ESD current flows in a path from stripe contact 128-via 152-metal 140-stripe contact 124.

Figure 3:
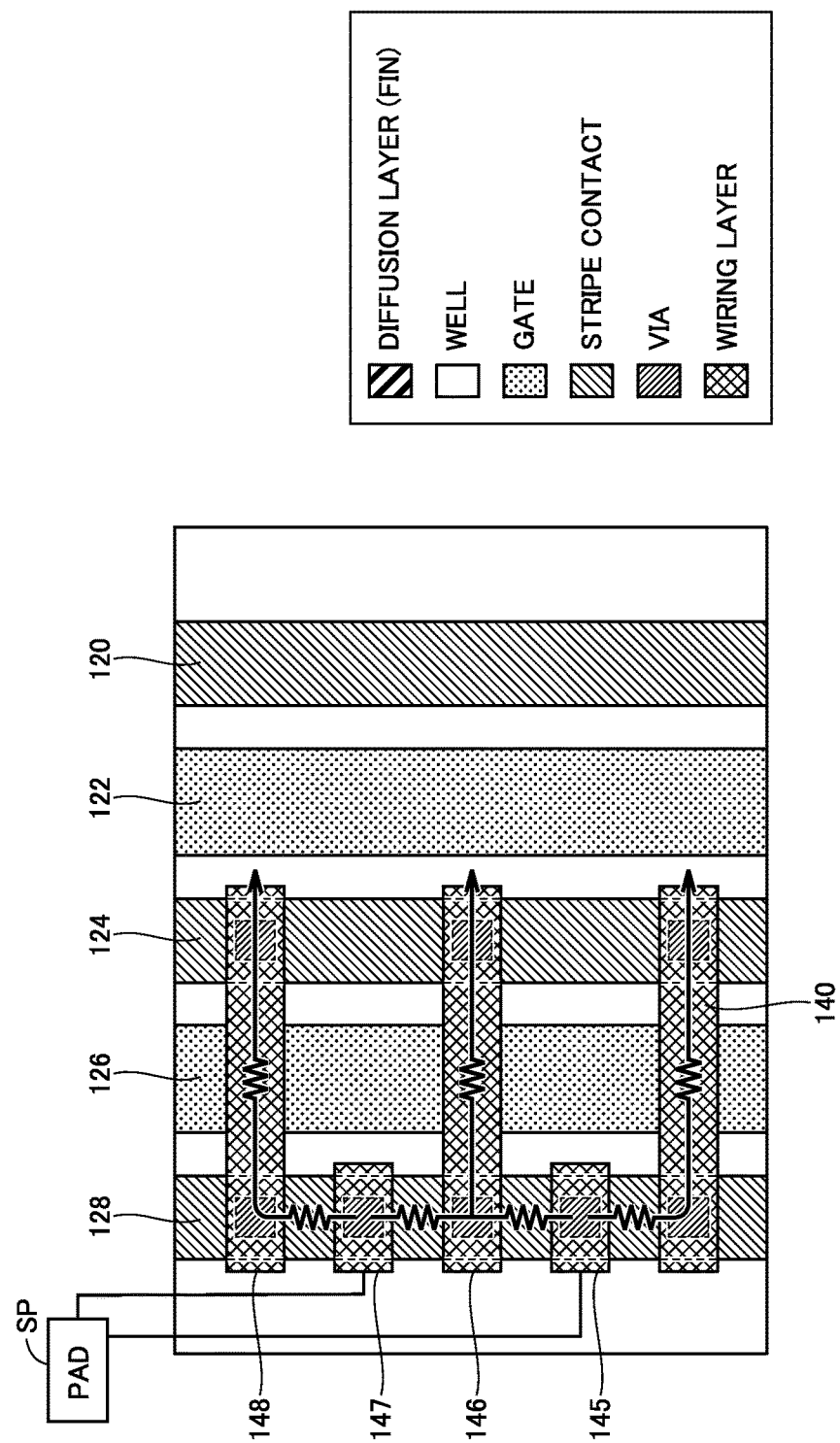
FIG. 3 is a diagram illustrating a structure of an ESD protection element based on a variation of the first embodiment.

FIG. 3 is a diagram illustrating a structure of an ESD protection element based on a variation of the first embodiment. As shown in FIG. 3, a plurality of paths can be provided in parallel with pad SP.

In this example, it is shown that a metal 147 connected to stripe contact 128 is provided, where metal 147 is connected to pad SP via an additional, not-shown upper layer.

By providing the plurality of paths connected in parallel with pad SP as in this configuration, the ESD current can be distributed to reduce a load on each portion.

Figure 4:
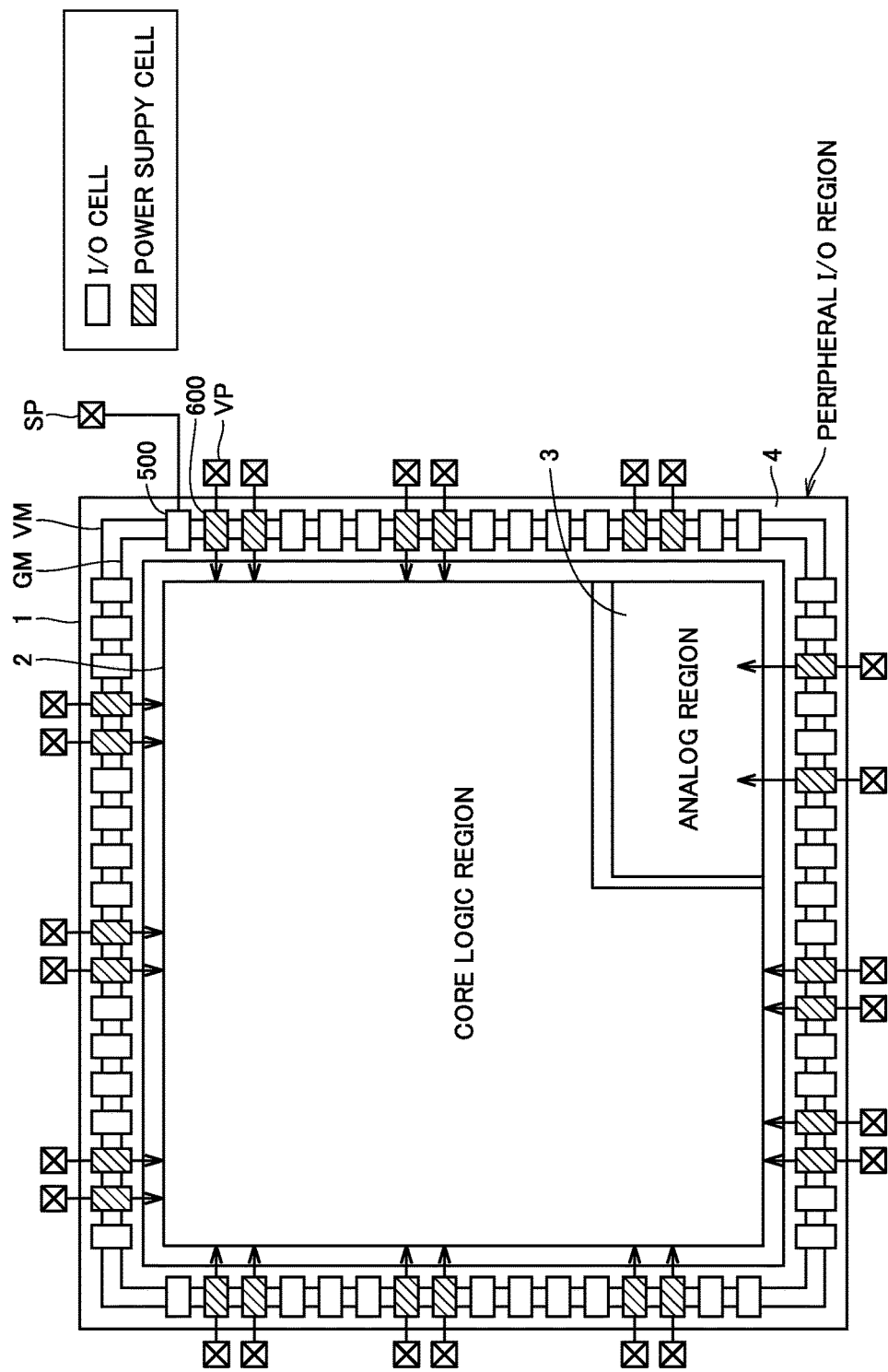
FIG. 4 is a diagram illustrating a semiconductor integrated circuit 1 based on the first embodiment in its entirety.

FIG. 4 is a diagram illustrating a semiconductor integrated circuit 1 based on the first embodiment in its entirety. As shown in FIG. 4, semiconductor integrated circuit 1 includes a peripheral I/O region 4 provided in an outer peripheral region, a core logic region 2 disposed in an inner region and configured as an ASIC (application specific integrated circuit) having prescribed functions, and an analog region 3 in which an analog circuit is formed.

Provided in peripheral I/O region 4 are I/O cells 500 serving as signal input/output interfaces, and power supply cells 600 that receive an input from an external power supply. In this case, it is shown that a power supply line VM and a ground line GM are disposed in the outer peripheral region. Pads VP are power supply pads, and connected to power supply cells 600. Pad SP is a signal pad, and connected to I/O cells 500.

Figure 5:
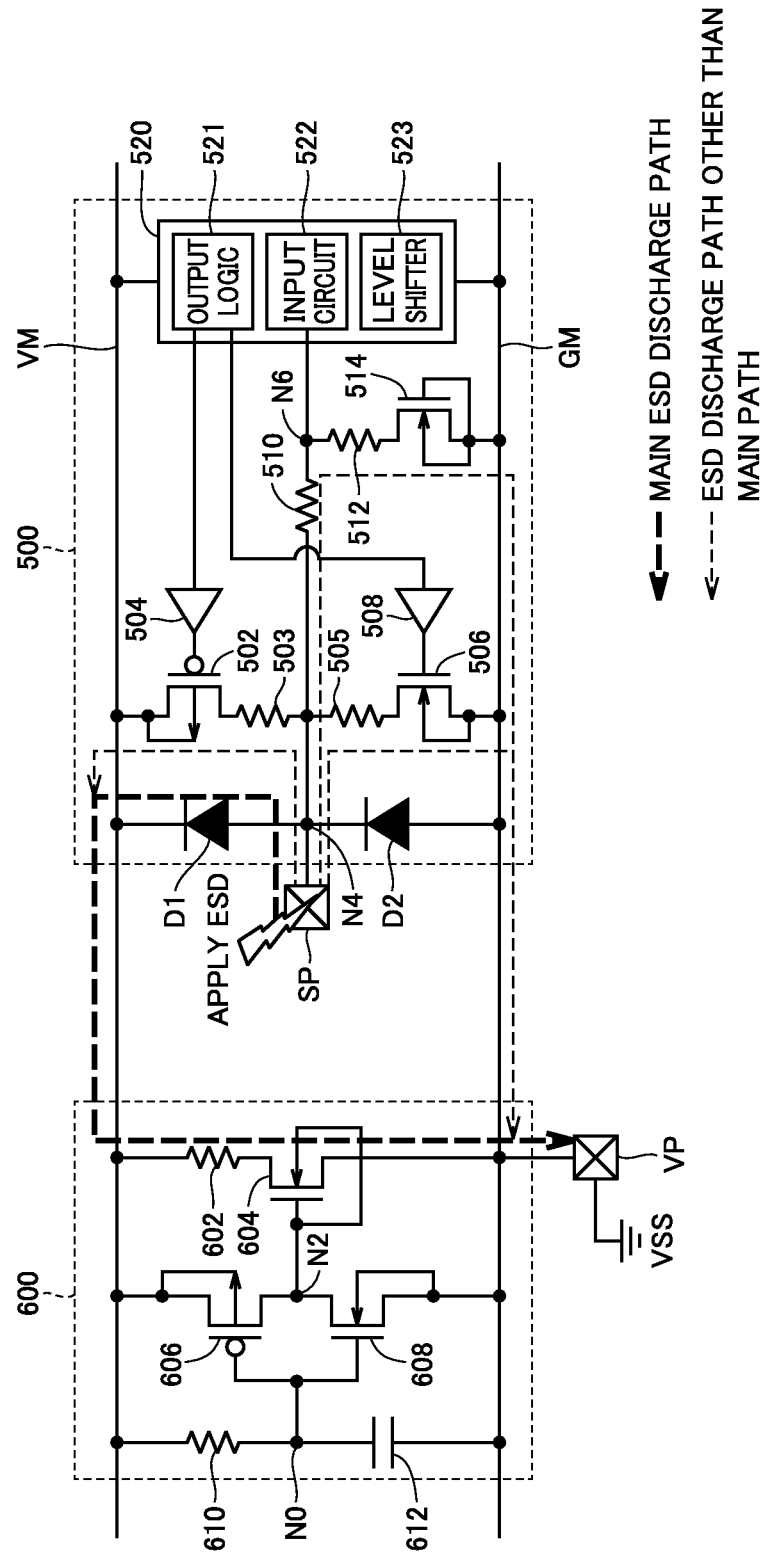
FIG. 5 is a diagram illustrating a circuit configuration of an I/O cell 500 and a power supply cell 600 based on the first embodiment.

FIG. 5 is a diagram illustrating a circuit configuration of I/O cell 500 and power supply cell 600 based on the first embodiment.

As shown in FIG. 5, I/O cell 500 includes protection diodes D1 and D2, a P channel MOS transistor 502, N channel MOS transistors 506 and 514, drivers 504 and 508, resistors 503, 505, 510 and 512, and an internal circuit 520.

Signal pad SP is connected to a node N4. Protection diode D1 is provided between node N4 and power supply line VM, with the anode side connected to node N4 and the cathode side connected to power supply line VM. Signal pad SP is an input/output pad which can receive an input signal and outputs an output signal.

Protection diode D2 is provided between node N4 and ground line GM, with the anode side connected to ground line GM and the cathode side connected to node N4. Resistor 503 and P channel MOS transistor 502 are provided in parallel with protection diode D1, and connected in series between node N4 and power supply line VM. P channel MOS transistor 502 receives an input of a signal from driver 504.

Resistor 505 and N channel MOS transistor 506 are provided in parallel with protection diode D2, and connected in series between node N4 and ground line GM. N channel MOS transistor 506 receives an input from driver 508.

Resistor 510 is provided between node N4 and a node N6. Resistor 512 and N channel MOS transistor 514 are provided in parallel with protection diode D2, and connected in series between node N6 and ground line GM. N channel MOS transistor 514 has a gate connected to ground line GM.

Internal circuit 520 is provided between power supply line VM and ground line GM. Internal circuit 520 includes an output logic 521 that drives drivers 504 and 508, an input circuit 522 that processes an input signal from pad SP via resistor 510, and a level shifter 523 that boosts/lowers a signal level.

One of drivers 504 and 508 operates in accordance with a signal from output logic 521. Then, P channel MOS transistor 502 or N channel MOS transistor 506 is rendered conductive to output a signal from signal pad SP.

Power supply cell 600 includes resistors 602 and 610 forming a power clamping circuit, a capacitor 612, a P channel MOS transistor 606, and N channel MOS transistors 604 and 608.

N channel MOS transistor 604 and resistor 602 are connected in series between power supply line VM and ground line GM. N channel MOS transistor 604 has a gate connected to a node N2. P channel MOS transistor 606 and N channel MOS transistor 608 are connected to node N2, and connected in series between power supply line VM and ground line GM. These transistors each have a gate connected to a node N0. Resistor 610 is connected between power supply line VM and node N0. Capacitor 612 is connected between node NO and ground line GM.

Ground line GM and pad VP are connected to each other. Pad VP is shown electrically connected to ground voltage VSS.

Although the configuration of a power clamping circuit has been described as an example of power supply cell 600, another circuit may be configured without being limited to this example.

The ESD current is shown entering (applied to) pad SP. In this case, in the circuit configuration according to this embodiment, the entering ESD current is discharged in a path from protection diode D1-resistor 602-N channel MOS transistor 604-pad VP, as a main ESD discharge path to pad VP connected to ground voltage VSS. In addition, the entering ESD current is discharged in a path from resistor 510-resistor 512-N channel MOS transistor 514-pad VP, as an ESD discharge path other than the main path. In addition, the entering ESD current is discharged in a path from resistor 505-N channel MOS transistor 506-pad VP, as an ESD discharge path other than the main path.

In this embodiment, in order to suppress the ESD current in the main ESD discharge path, resistor 503 connected to P channel MOS transistor 502 is formed as a ballast resistor. In addition, resistor 602 connected to N channel MOS transistor 604 is formed as a ballast resistor.

Further, in order to suppress the ESD current in the ESD discharge paths other than the main path, resistor 505 connected to N channel MOS transistor 506 is formed as a ballast resistor. In addition, resistor 512 connected to N channel MOS transistor 514 is formed as a ballast resistor.

By forming resistors 503, 505, 512 and 602 as ballast resistors by providing the dummy gate electrode and utilizing the stripe contact adjacent to this dummy gate electrode and the like as described above, the ESD tolerance can be improved in a simple manner.

It is noted that the relation of connection between the transistors and resistors can be reversed.

Variation of First Embodiment

Although the first embodiment above has described forming the ballast resistor on the source side of the transistor in the ESD discharge path, a ballast resistor can be formed on both the source side and the drain side.

This example will describe, as an example, forming a ballast resistor on both the source side and the drain side of N channel MOS transistor 604.

Figure 6:
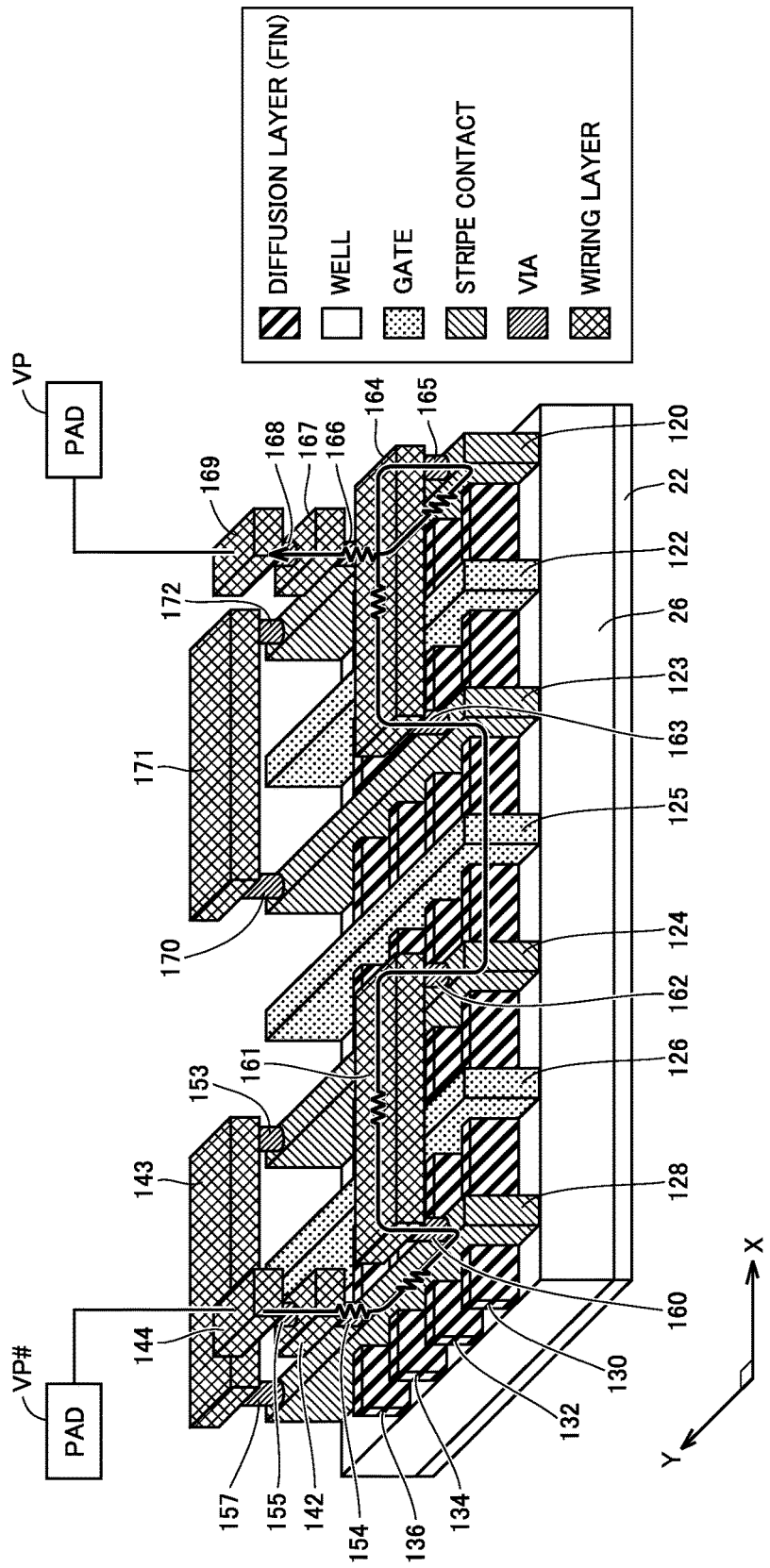
FIG. 6 is a diagram schematically illustrating the principle of an ESD protection element according to a variation of the first embodiment.

FIG. 6 is a diagram schematically illustrating the principle of an ESD protection element according to a variation of the first embodiment.

Referring to FIG. 6, the ESD protection element based on the variation of the first embodiment is shown having a configuration where a resistive component is added to both the source side and the drain side, as compared to the ESD protection element in the first embodiment.

Specifically, it is shown that a dummy gate electrode is provided on opposing sides of a transistor. The semiconductor device includes a plurality of gate electrodes 122, 125 and 126 of a transistor formed on well 26 of semiconductor substrate 22, and a plurality of stripe contacts 120, 123, 124 and 128 formed along the length direction (Y direction) of gate electrodes 122, 125 and 126 so as to form a source and a drain of the transistor. Gate electrode 125, and stripe contacts 123 and 124 provided on opposing sides of gate electrode 125 form a conductive transistor. Gate electrodes 122 and 126 are used as dummy gate electrodes.

The semiconductor device further includes metals 164 and 171 extending over dummy gate electrode 122 to electrically connect together stripe contacts 120 and 123 formed on opposing sides of dummy gate electrode 122, and metals 143 and 161 extending over dummy gate electrode 126 to electrically connect together stripe contacts 124 and 128 formed on opposing sides of dummy gate electrode 126. The semiconductor device further includes a pad VP # connected to stripe contact 128, and pad VP connected to stripe contact 120. In this example, pad VP is connected, as an example, to ground voltage VSS. In this example, pad VP # is connected, as an example, to a power supply voltage VCC.

Stripe contact 128 is connected to pad VP # via the upper metal wiring layer. Specifically, pad VP # is connected to stripe contact 128 via metal 144 formed in the second layer, metal 142 formed in the first layer, via 155 provided between metal 144 formed in the second layer and metal 142 formed in the first layer, and via 154 provided between metal 142 formed in the first layer and stripe contact 128.

Stripe contact 120 is connected to pad VP via the upper metal wiring layer. Specifically, pad VP is connected to stripe contact 120 via a metal 169 formed in the second layer, a metal 167 formed in the first layer, a via 168 provided between metal 169 formed in the second layer and metal 167 formed in the first layer, and a via 166 provided between metal 167 formed in the first layer and stripe contact 120.

A via 163 is provided between stripe contact 123 and metal 164 formed in the first layer, and a via 165 is provided between metal 164 and stripe contact 120.

A via 170 is provided between stripe contact 123 and metal 171 formed in the first layer, and a via 172 is provided between metal 171 and stripe contact 120.

A via 162 is provided between stripe contact 124 and metal 161 formed in the first layer, and a via 160 is provided between metal 161 and stripe contact 128.

A via 153 is provided between stripe contact 124 and metal 143 formed in the first layer, and a via 157 is provided between metal 143 and stripe contact 128.

Each of stripe contacts 120, 123, 124 and 128 is formed alternately with each of gate electrodes 122, 125 and 126 at regular intervals along the X direction.

Diffusion layers (fins) 130, 132, 134 and 136 are provided between stripe contacts 120, 123, 124 and 128. Gate electrodes 122, 125 and 126 are formed to extend over diffusion layers (fins) 130, 132, 134 and 136 along the Y direction.

In this configuration, when the ESD current is applied to pad VP#, a current path is formed from pad VP #-metal 144-via 155-metal 142-via 154-stripe contact 128-via 160-metal 161-via 162-stripe contact 124-the conductive transistor-stripe contact 123-via 163-metal 164-via 165-stripe contact 120-via 166-metal 167-via 168-metal 169-pad VP (ground voltage VSS).

In the configuration according to the variation of the first embodiment, ballast resistors are formed by providing the dummy gate electrode on both the source side and the drain side of the conductive transistor, and utilizing the stripe contacts adjacent to the dummy gate electrodes and the like.

Specifically, on the source side (pad VP # side) of the conductive transistor, a ballast resistor is formed including a resistive component formed of metal 161 and vias 160, 162, and a resistive component formed of stripe contact 128. A resistive component formed of vias 153, 157 and metal 143 is also formed.

On the drain side (pad VP side) of the conductive transistor, a ballast resistor is formed including a resistive component formed of metal 164 and vias 163, 165, and a resistive component formed of stripe contact 120. A resistive component formed of vias 170, 172 and metal 171 is also formed.

As a result, the ballast resistors can be formed in a simple manner to improve the protection tolerance of the ESD protection element, without requiring the cumbersome steps of isolating a diffusion layer by STI, providing the isolated diffusion layer with a resistive component and the like as in the conventional configuration.

By forming the ballast resistor on both the drain side and the source side, the ESD tolerance can be improved for the entry of the ESD current from either the drain side or the source side.

Further, by adding the ballast resistor to increase the on-resistance of a parasitic bipolar transistor, the parasitic bipolar transistor of a plurality of fingers can be readily operated.

Figure 7:
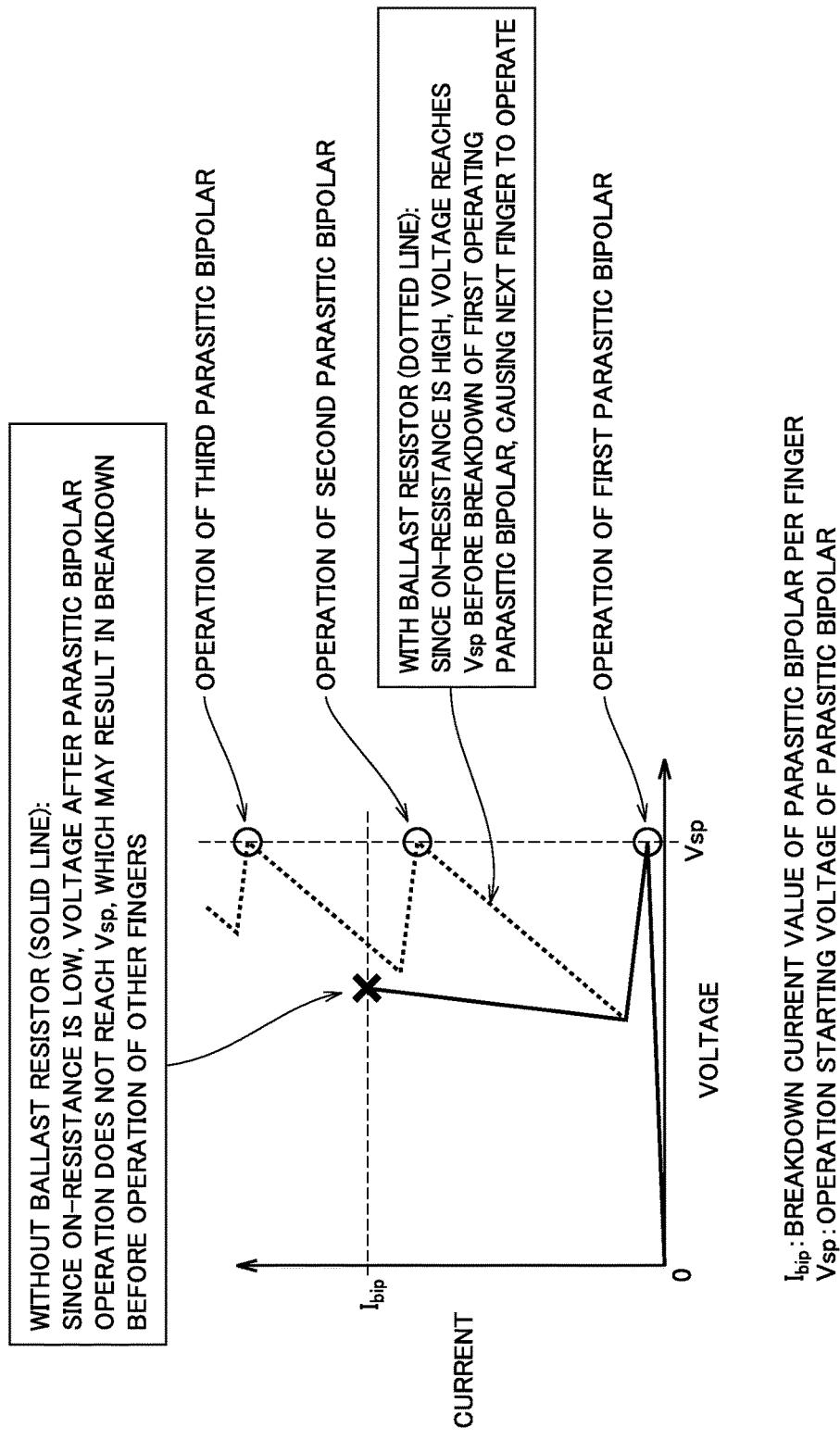
FIG. 7 is a diagram illustrating the operation of a parasitic bipolar transistor of a plurality of fingers with the addition of a ballast resistor.

FIG. 7 is a diagram illustrating the operation of a parasitic bipolar transistor of a plurality of fingers with the addition of a ballast resistor.

As shown in FIG. 7, when there is no ballast resistor, the on-resistance is low and thus the voltage after the operation of a first parasitic bipolar transistor does not increase to an operating voltage Vsp of the parasitic bipolar transistor, which may result in current breakdown before the operation of a second parasitic bipolar transistor.

When a ballast resistor is added to increase the on-resistance of the parasitic bipolar transistor, on the other hand, the voltage reaches operating voltage Vsp of the parasitic bipolar transistor before breakdown of the first parasitic bipolar transistor, causing the second parasitic bipolar transistor to operate. By setting an appropriate ballast resistor value, the plurality of parasitic bipolar transistors can be successively operated to improve the discharge capacity of the transistor as a whole, thereby improving the ESD tolerance.

Figure 8:
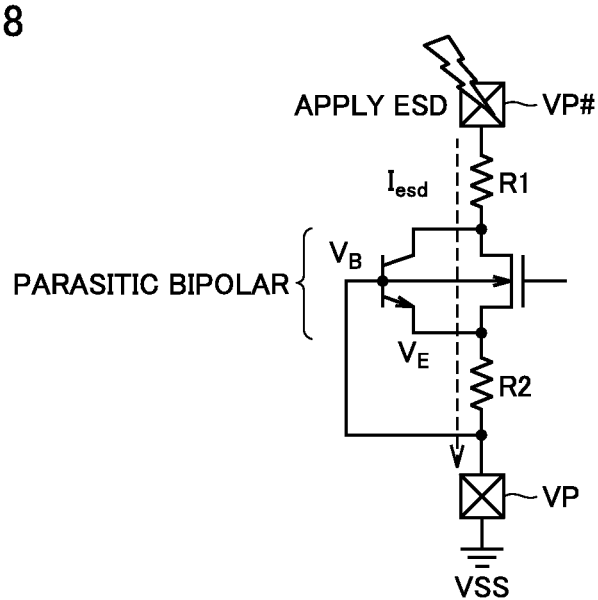
FIG. 8 is a diagram illustrating the on-resistance of a parasitic bipolar transistor.

FIG. 8 is a diagram illustrating the on-resistance of a parasitic bipolar transistor. By adding a ballast resistor on both the drain side and the source side of a conductive transistor as shown in FIG. 8, the ballast resistor value can be doubled from the value in the first embodiment.

In addition, an emitter potential of the parasitic bipolar transistor becomes higher than a base potential by Iesd×R2. The parasitic bipolar transistor is thus turned off and a current will be less likely to flow, whereby the resistance of the parasitic bipolar transistor can be increased.

Consequently, the on-resistance of the parasitic bipolar transistor can be increased to facilitate the operation of the parasitic bipolar transistor of a plurality of fingers.

The same can be likewise applied to the following embodiments.

Second Embodiment

Figure 9:
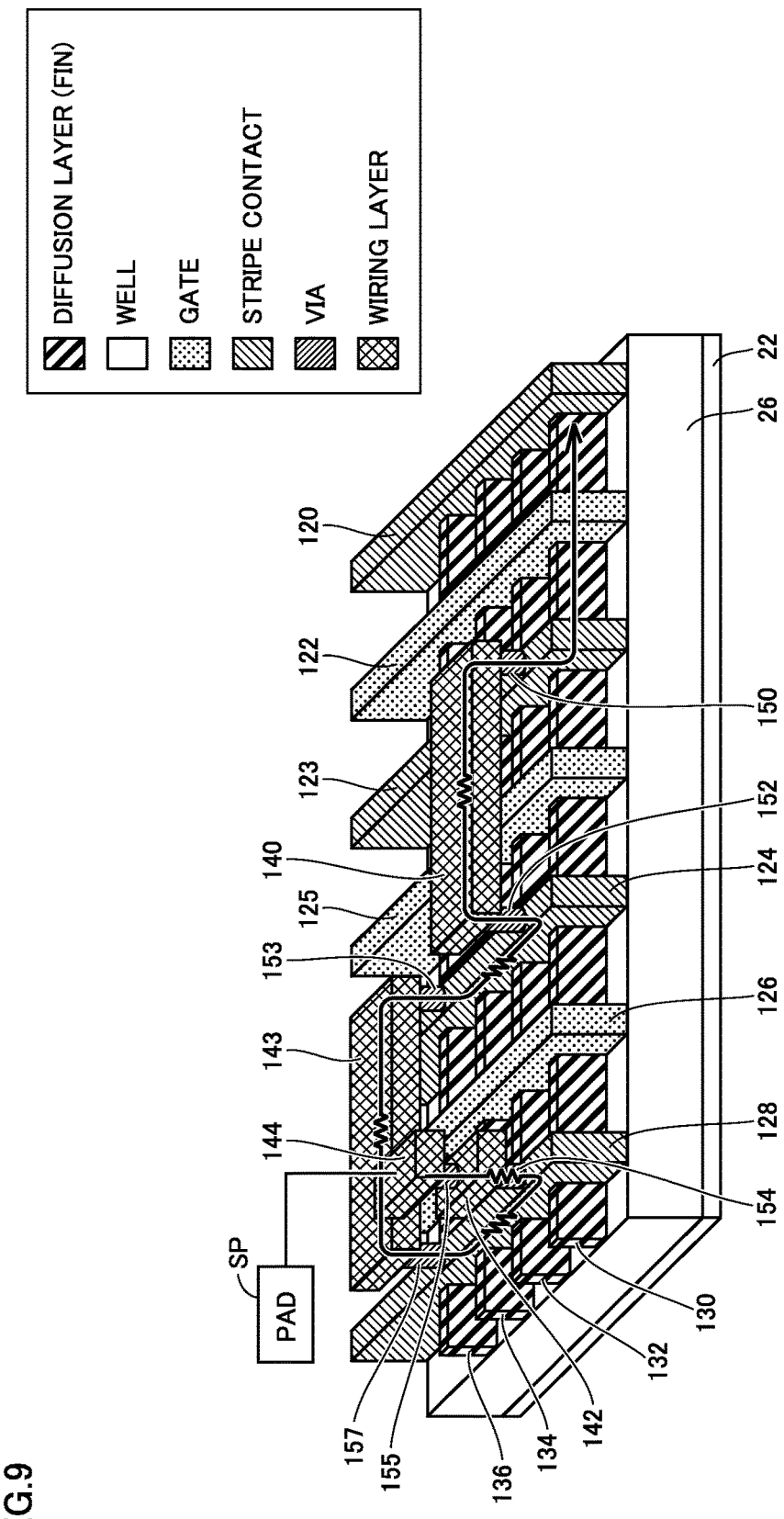
FIG. 9 is a diagram schematically illustrating the principle of an ESD protection element in a second embodiment.

FIG. 9 is a diagram schematically illustrating the principle of an ESD protection element in a second embodiment.

Referring to FIG. 9, the ESD protection element based on the second embodiment is shown having a configuration where a resistive component is further added as compared to the ESD protection element in the first embodiment.

Specifically, it is shown that a plurality of dummy gate electrodes are provided. The semiconductor device includes the plurality of gate electrodes 122, 125 and 126 of a transistor formed on well 26 of semiconductor substrate 22, and the plurality of stripe contacts 120, 123, 124 and 128 formed along the length direction (Y direction) of gate electrodes 122, 125 and 126 so as to form a source and a drain of the transistor. Gate electrode 122, and stripe contacts 120 and 123 provided on opposing sides of gate electrode 122 form a conductive transistor. Although not shown, the reference potential (ground voltage VSS by way of example) is applied to stripe contact 120 of the conductive transistor. Gate electrodes 125 and 126 are used as dummy gate electrodes. The semiconductor device further includes metal 140 extending over dummy gate electrode 125 to electrically connect together stripe contacts 123 and 124 formed on opposing sides of dummy gate electrode 125, metal 143 extending over dummy gate electrode 126 to electrically connect together stripe contacts 124 and 128 formed on opposing sides of dummy gate electrode 126, and pad SP connected to stripe contact 128.

Stripe contact 128 is connected to pad SP via the upper metal wiring layer. Specifically, pad SP is connected to stripe contact 128 via metal 144 formed in the second layer, metal 142 formed in the first layer, via 155 provided between metal 144 formed in the second layer and metal 142 formed in the first layer, and via 154 provided between metal 142 formed in the first layer and stripe contact 128.

Via 150 is provided between stripe contact 123 and metal 140 formed in the first layer, and via 152 is provided between metal 140 and stripe contact 124.

Via 153 is provided between stripe contact 124 and metal 143 formed in the first layer, and via 157 is provided between metal 143 and stripe contact 128.

Each of stripe contacts 120, 123, 124 and 128 is formed alternately with each of gate electrodes 122, 125 and 126 at regular intervals along the X direction.

Diffusion layers (fins) 130, 132, 134 and 136 are provided between stripe contacts 120, 123, 124 and 128. Gate electrodes 122, 125 and 126 are formed to extend over diffusion layers (fins) 130, 132, 134 and 136 along the Y direction.

In this configuration, when the ESD current is applied to pad SP, a current path is formed from pad SP-metal 144-via 155-metal 142-via 154-stripe contact 128-via 157-metal 144-via 153-stripe contact 124-via 152-metal 140-via 150-stripe contact 123-the conductive transistor-ground voltage VSS.

In the configuration according to the second embodiment, a ballast resistor is formed by providing a plurality of (two) dummy gate electrodes, and utilizing the stripe contacts adjacent to the dummy gate electrodes and the like.

Specifically, a ballast resistor is formed including a resistive component formed of metals 142, 144 and vias 154, 155, a resistive component formed of stripe contact 128, a resistive component formed of vias 153, 157 and metal 143, and a resistive component formed of stripe contact 124, vias 150, 152 and metal 140.

As a result, the ballast resistor can be formed in a simple manner to improve the protection tolerance of the ESD protection element, without requiring the cumbersome steps of isolating a diffusion layer by STI, providing the isolated diffusion layer with a resistive component and the like as in the conventional configuration.

Further, stripe contacts 124 and 128 can be utilized as resistive components by providing the plurality of dummy gate electrodes, and the resistance value of the ballast resistor can be readily adjusted.

Although this example has described utilizing two dummy gate electrodes, the ballast resistor can be formed by utilizing stripe contacts adjacent to more dummy gate electrodes and the like, without being limited to this example.

Third Embodiment

Figure 10:
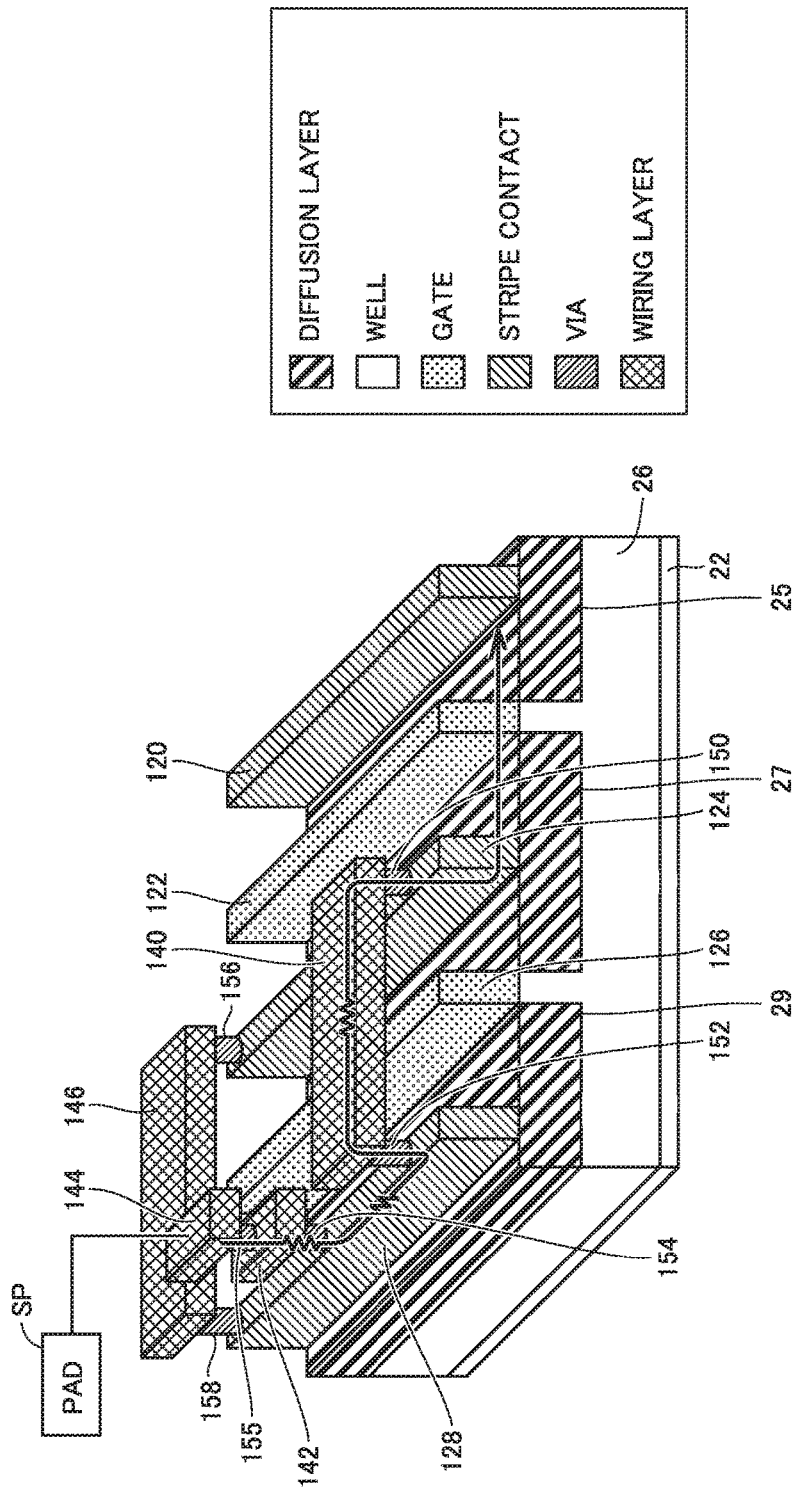
FIG. 10 is a diagram schematically illustrating the principle of an ESD protection element in a third embodiment.

FIG. 10 is a diagram schematically illustrating the principle of an ESD protection element in a third embodiment.

Referring to FIG. 10, a planar FET is shown. The stripe contacts can be utilized in this planar FET as well.

Well 26 is formed on semiconductor substrate 22, and well 26 is provided with diffusion regions 25, 27 and 29 for forming a source and a drain.

The semiconductor device includes the plurality of gate electrodes 122 and 126 of a transistor formed on well 26 of semiconductor substrate 22, and the plurality of stripe contacts 120, 124 and 128 formed along the length direction (Y direction) of gate electrodes 122 and 126 so as to form a source and a drain of the transistor. Gate electrode 122, and stripe contacts 120 and 124 provided on opposing sides of gate electrode 122 form a conductive transistor. Although not shown, the reference potential (ground voltage VSS by way of example) is applied to stripe contact 120 of the conductive transistor. Gate electrode 126 is used as a dummy gate electrode.

The semiconductor device further includes metals 140 and 146 extending over dummy gate electrode 126 to electrically connect together stripe contacts 124 and 128 formed on opposing sides of dummy gate electrode 126, and pad SP connected to stripe contact 128.

Stripe contact 128 is connected to pad SP via the upper metal wiring layer. Specifically, pad SP is connected to stripe contact 128 via metal 144 formed in the second layer, metal 142 formed in the first layer, via 155 provided between metal 144 formed in the second layer and metal 142 formed in the first layer, and via 154 provided between metal 142 formed in the first layer and stripe contact 128.

Via 150 is provided between stripe contact 124 and metal 140 formed in the first layer, and via 152 is provided between metal 140 and stripe contact 128.

Via 156 is provided between stripe contact 124 and metal 146 formed in the first layer, and via 158 is provided between metal 146 and stripe contact 128.

Each of stripe contacts 120, 124 and 128 is formed alternately with each of gate electrodes 122 and 126 at regular intervals along the X direction.

In this configuration, when the ESD current is applied to pad SP, a current path is formed from pad SP-metal 144-via 155-metal 142-via 154-stripe contact 128-via 152-metal 140-via 150-stripe contact 124-the conductive transistor-ground voltage VSS.

When the conductive transistor has low ESD tolerance, the entry of the ESD current through pad SP causes the occurrence of current concentration, which may result in breakdown of the conductive transistor (ESD protection element).

In this embodiment, a ballast resistor is formed by providing the dummy gate electrode, and utilizing the stripe contact adjacent to this dummy gate electrode and the like.

Specifically, a ballast resistor is formed including a resistive component formed of metals 142, 144 and vias 154, 155, a resistive component formed of stripe contact 128, and a resistive component formed of vias 150, 152 and metal 140.

As a result, the ballast resistor can be formed in a simple manner to improve the protection tolerance of the ESD protection element, without requiring the cumbersome steps of providing an isolated diffusion layer with a resistive component and the like.

It is noted that this embodiment can be applied when an SOI (Silicon ON Insulator) is employed.

Although the embodiments of the present invention have been described above, it should be understood that the embodiments disclosed herein are illustrative and non-restrictive in every respect. The scope of the present invention is defined by the terms of the claims, and is intended to include any modifications within the scope and meaning equivalent to the terms of the claims.

What is claimed is:

1. A semiconductor device comprising:
    a semiconductor substrate including a main surface;
    a protruding portion that is a portion of the semiconductor substrate, protrudes from the main surface, has a width in a first direction of the main surface, and extends in a second direction perpendicular to the first direction in plan view,
    a first gate electrode and a second gate electrode which are arranged over the protruding portion and extend in the first direction in plan view; and a first stripe contact, a second stripe contact and a third stripe contact which are arranged over the protruding portion and extend in the first direction in plan view;

wherein the first gate electrode is located between the first stripe contact and the second stripe contact, wherein the second gate electrode is located between the second stripe contact and the third stripe contact, wherein the second stripe contact is located between the first gate electrode and the second gate electrode, wherein the second gate electrode, the second stripe contact, the third stripe contact and a protruding portion of the semiconductor substrate are used so as to form a conductive transistor such that the second stripe contact is connected to either a source or a drain of the conductive transistor and the third stripe contact is connected to the other of the conductive transistor, wherein the first gate electrode is used as a first dummy gate electrode, wherein a first metal extends along the second direction and over the first dummy gate electrode, and is electrically connected to the first stripe contact and the second stripe contact, and wherein a first pad is electrically connected to the first metal via the first stripe contact.

2. The semiconductor device according to claim 1, wherein the first pad is electrically connected to a second metal formed in a first layer and a third metal formed in a second layer which is located above the first layer, and wherein the second metal and the third metal are located between the first pad and the first stripe contact.

3. The semiconductor device according to claim 1, further comprising an integrated circuit unit connected in parallel with the conductive transistor for the first pad, wherein the conductive transistor allows a flow of an electrostatic discharge current which has been input to the first pad.

4. The semiconductor device according to claim 1, wherein the first pad is a signal pad for at least one of an input signal and an output signal to and from an integrated circuit unit.

5. The semiconductor device according to claim 1, wherein the first pad is a power supply pad of an integrated circuit unit.

6. The semiconductor device according to claim 1, wherein the second gate electrode is used as a second dummy gate electrode, and wherein a second metal extends along the second direction and over the second dummy gate electrode, and is electrically connected to the second stripe contact and the third stripe contact.

7. The semiconductor device according to claim 1, further comprising a third gate electrode;

a fourth stripe contact;

wherein the third stripe contact is located between the second gate electrode and the third gate electrode, wherein the third gate electrode is located between the third stripe contact and the fourth stripe contact, wherein a second metal extends along the second direction and over the third gate electrode, and is electrically connected to the third stripe contact and the fourth stripe contact, and wherein a second pad is electrically connected to the second metal via the fourth stripe contact.

* * * * *